(12) United States Patent
Shimomura et al.

(10) Patent No.: US 7,731,568 B2
(45) Date of Patent: Jun. 8, 2010

(54) POLISHING PAD AND SEMICONDUCTOR DEVICE MANUFACTURING METHOD

(75) Inventors: Tetsuo Shimomura, Ohtsu (JP); Masahiko Nakamori, Ohtsu (JP); Takatoshi Yamada, Ohtsu (JP); Kazuyuki Ogawa, Osaka (JP); Atsushi Kazuno, Osaka (JP); Masahiro Watanabe, Osaka (JP)

(73) Assignee: Toyo Tire & Rubber Co., Ltd., Osaka (JP)

( * ) Notice: Subject to any disclaimer, the term of this patent is extended or adjusted under 35 U.S.C. 154(b) by 0 days.

(21) Appl. No.: 10/598,717

(22) PCT Filed: Oct. 20, 2004

(86) PCT No.: PCT/JP2004/015480

§ 371 (c)(1),
(2), (4) Date: Sep. 8, 2006

(87) PCT Pub. No.: WO2005/088690

PCT Pub. Date: Sep. 22, 2005

(65) Prior Publication Data

US 2007/0190905 A1   Aug. 16, 2007

(30) Foreign Application Priority Data

Mar. 11, 2004  (JP)  ............... 2004-069423
Mar. 11, 2004  (JP)  ............... 2004-069498

(51) Int. Cl.
*B24B 7/00* (2006.01)
*B24B 7/19* (2006.01)
*B24B 5/00* (2006.01)
*B24B 29/00* (2006.01)
*B24D 11/00* (2006.01)

(52) U.S. Cl. ............. 451/41; 451/288; 451/526
(58) Field of Classification Search ............... 451/41, 451/6, 526, 533, 288
See application file for complete search history.

(56) References Cited

U.S. PATENT DOCUMENTS 4,502,253 A * 3/1985 Lorenzi et al. .............. 451/6

(Continued)

FOREIGN PATENT DOCUMENTS

EP   1 252 973 A1   10/2002

(Continued)

*Primary Examiner*—Joseph J Hail, III
*Assistant Examiner*—Alvin J Grant
(74) *Attorney, Agent, or Firm*—Knobbe Martens Olson & Bear, LLP

(57) ABSTRACT

The object of the invention is to provide a polishing pad capable of maintaining high-precision end-point optical detection over a long period from the start of use to the end of use even if polishing is performed with an alkaline or acid slurry, as well as a method of manufacturing a semiconductor device with this polishing pad. The polishing pad of the invention is used in chemical mechanical polishing and has a polishing region and a light-transmitting region, wherein the light-transmitting region satisfies that the difference $\Delta T$ ($\Delta T = T_0 - T_1$) (%) between $T_0$ and $T_1$ is within 10(%) over the whole range of measurement wavelengths of from 400 to 700 nm, wherein $T_1$ is the light transmittance (%) of the light-transmitting region measured at the measurement wavelength $\lambda$ after dipping for 24 hours in a KOH aqueous solution at pH 11 or an $H_2O_2$ aqueous solution at pH 4 and $T_0$ is the light-transmittance (%) measured at the measurement wavelength $\lambda$ before the dipping.

12 Claims, 2 Drawing Sheets

U.S. PATENT DOCUMENTS

| | | |
|---|---|---|
| 5,069,002 A | 12/1991 | Sandhu et al. |
| 5,081,421 A | 1/1992 | Miller et al. |
| 5,196,353 A | 3/1993 | Sandhu et al. |
| 5,559,428 A | 9/1996 | Li et al. |
| 6,544,104 B1 | 4/2003 | Koike et al. |
| 6,663,469 B2 * | 12/2003 | Kimura et al. ............ 451/41 |
| 6,676,483 B1 | 1/2004 | Roberts |
| 6,832,949 B2 * | 12/2004 | Konno et al. ............ 451/285 |
| 2002/0137434 A1* | 9/2002 | Choi et al. ............ 451/28 |
| 2002/0173231 A1* | 11/2002 | Hasegawa ............ 451/6 |
| 2003/0171081 A1* | 9/2003 | Komukai et al. ............ 451/285 |
| 2004/0014395 A1* | 1/2004 | Birang et al. ............ 451/5 |
| 2004/0203320 A1* | 10/2004 | Hosaka et al. ............ 451/6 |

FOREIGN PATENT DOCUMENTS

| | | |
|---|---|---|
| EP | 1 306 163 A1 | 5/2003 |
| JP | 55-106769 | 8/1980 |
| JP | 7-135190 | 5/1995 |
| JP | 9-7985 | 1/1997 |
| JP | 9-36072 | 2/1997 |
| JP | 10-83977 A | 3/1998 |
| JP | 11-512977 A | 11/1999 |
| JP | 2002-324770 | 11/2002 |
| JP | 2003-48151 | 2/2003 |
| JP | 2003-133270 | 5/2003 |
| JP | 2004-228101 | 8/2004 |
| WO | WO 01/15861 A1 | 3/2001 |

* cited by examiner

POLISHING PAD AND SEMICONDUCTOR DEVICE MANUFACTURING METHOD

This application is the U.S. National Phase under 35 U.S.C. §371 of International Application PCT/JP2004/015480, filed Oct. 20, 2004, which claims priority to Japanese Patent Application No. 2004-069423, filed Mar. 11, 2004 and No. 2004-069498, filed Mar. 11, 2004. The International Application was published under PCT Article 21(2) in a language other than English.

TECHNICAL FIELD

The present invention relates to a polishing pad used in planarizing an uneven surface of a wafer by chemical mechanical polishing (CMP) and in particular to a polishing pad having a window for sensing a polished state etc. by an optical means, in CMP using alkaline slurry or acidic slurry, as well as a method of manufacturing a semiconductor device by the polishing pad.

BACKGROUND OF THE INVENTION

Production of a semiconductor device involves a step of forming an electroconductive film on the surface of a wafer to form a wiring layer by photolithography, etching etc., a step of forming an interlaminar insulating film on the wiring layer, etc., and an uneven surface made of an electroconductive material such as metal and an insulating material is generated on the surface of a wafer by these steps. In recent years, processing for fine wiring and multilayer wiring is advancing for the purpose of higher integration of semiconductor integrated circuits, and accordingly techniques of planarizing an uneven surface of a wafer have become important.

As the method of planarizing an uneven surface of a wafer, a CMP method is generally used. CMP is a technique wherein while the surface of a wafer to be polished is pressed against a polishing surface of a polishing pad, the surface of the wafer is polished with an abrasive in the form of slurry having abrasive grains dispersed therein (hereinafter, referred to as slurry).

As shown in FIG. 1, a polishing apparatus used generally in CMP is provided for example with a polishing platen 2 for supporting a polishing pad 1, a supporting stand (polishing head) 5 for supporting a polished material (wafer) 4, a backing material for uniformly pressurizing a wafer, and a mechanism of feeding an abrasive. The polishing pad 1 is fitted with the polishing platen 2 for example via a double-coated tape. The polishing platen 2 and the supporting stand 5 are provided with rotating shafts 6 and 7 respectively and are arranged such that the polishing pad 1 and the polished material 4, both of which are supported by them, are opposed to each other. The supporting stand 5 is provided with a pressurizing mechanism for pushing the polished material 4 against the polishing pad 1.

When such CMP is conducted, there is a problem of judging the planarity of wafer surface. That is, the point in time when desired surface properties or planar state are reached should be detected. With respect to the thickness of an oxide film, polishing speed etc., the polishing treatment of a test wafer has been conducted by periodically treating the wafer, and after the results are confirmed, a wafer serving as a product is subjected to polishing treatment.

In this method, however, the treatment time of a test wafer and the cost for the treatment are wasteful, and a test wafer and a product wafer not subjected to processing are different in polishing results due to a loading effect unique to CMP, and accurate prediction of processing results is difficult without actual processing of the product wafer.

Accordingly, there is need in recent years for a method capable of in situ detection of the point in time when desired surface properties and thickness are attained at the time of CMP processing, in order to solve the problem described above. In such detection, various methods are used.

The detection means proposed at present include:

(1) a method of detecting torque wherein the coefficient of friction between a wafer and a pad is detected as a change of the rotational torque of a wafer-keeping head and a platen (U.S. Pat. No. 5,069,002), (2) an electrostatic capacity method of detecting the thickness of an insulating film remaining on a wafer (U.S. Pat. No. 5,081,421), (3) an optical method wherein a film thickness monitoring mechanism by a laser light is integrated in a rotating platen (JP-A 9-7985 and JP-A 9-36072), (4) a vibrational analysis method of analyzing a frequency spectrum obtained from a vibration or acceleration sensor attached to a head or spindle, (5) a detection method by applying a built-in differential transformer in a head, (6) a method wherein the heat of friction between a wafer and a polishing pad and the heat of reaction between slurry and a material to be polished are measured by an infrared radiation thermometer (U.S. Pat. No. 5,196,353), (7) a method of measuring the thickness of a polished material by measuring the transmission time of supersonic waves (JP-A 55-106769 and JP-A 7-135190), and (8) a method of measuring the sheet resistance of a metallic film on the surface of a wafer (U.S. Pat. No. 5,559,428). At present, the method (1) is often used, but the method (3) comes to be used mainly from the viewpoint of measurement accuracy and spatial resolution in non-constant measurement.

The optical detection means as the method (3) is specifically a method of detecting the end-point of polishing by irradiating a wafer via a polishing pad through a window (light-transmitting region) with a light beam, and monitoring an interference signal generated by reflection of the light beam.

At present, a He—Ne laser light having a wavelength light in the vicinity of 600 nm and a white light using a halogen lamp having a wavelength light in 380 to 800 nm is generally used.

In such method, the end-point is determined by knowing an approximate depth of surface unevenness by monitoring a change in the thickness of a surface layer of a wafer. When such change in thickness becomes equal to the thickness of unevenness, the CMP process is finished. As a method of detecting the end-point of polishing by such optical means and a polishing pad used in the method, various methods and polishing pads have been proposed.

A polishing pad having, as least a part thereof, a solid and uniform transparent polymer sheet passing a light of wavelengths of 190 to 3500 nm therethrough is disclosed (Japanese Patent Application National Publication (Laid-Open) No. 11-512977). Further, a polishing pad having a stepped transparent plug inserted into it is disclosed (JP-A 9-7985). A polishing pad having a transparent plug on the same surface as a polishing surface is disclosed (JP-A 10-83977). Further, a polishing pad wherein a light-permeable member comprises a water-insoluble matrix material and water-soluble particles dispersed in the water-insoluble matrix material and the light transmittance thereof at 400 to 800 nm is 0.1% or more is disclosed (JP-A 2002-324769 and JP-A 2002-324770). It is disclosed that a window for end-point detection is used in any of the polishing pad.

As described above, a He—Ne laser light and a white light using a halogen lamp are used as the light beam, and when the white light is used, there is an advantage that the light of various wavelengths can be applied onto a wafer, and many profiles of the surface of the wafer can be obtained. When this white light is used as the light beam, detection accuracy should be increased in a broad wavelength range.

In high integration and micronization in production of semiconductors in the future, the wiring width of an integrated circuit is expected to be further decreased for which highly accurate optical end-point detection is necessary, but the conventional window for end-point detection does not have sufficiently satisfactory accuracy in a broad wavelength range. Particularly, the detection accuracy of the polishing pad may be satisfactory in a certain degree at the time of the start of use, but there is a problem when polished with alkaline polishing slurry or acidic polishing slurry, the light-transmitting region is gradually made turbid or deteriorated to lower end-point detection accuracy. Accordingly, the conventional window cannot maintain high-precision end-point optical detection over a long period from the start of use to the end of use.

DISCLOSURE OF THE INVENTION

The present invention was made for solving the problem described above, and the object of the present invention is to provide a polishing pad capable of maintaining high-precision end-point optical detection over a long period from the start of use to the end of use even if polishing is performed with an alkaline or acidic slurry, as well as a method of manufacturing a semiconductor device by using the polishing pad.

In view of the present situation described above, the present inventors made extensive study, and as a result, they found that the following light-transmitting region is used as a light-transmitting region for a polishing pad thereby being capable of solving the problem described above.

That is, one aspect of the invention relates to a polishing pad having a polishing region and a light-transmitting region used in chemical mechanical polishing, wherein the light-transmitting region satisfies that the difference $\Delta T$ ($\Delta T = T_0 - T_1$) (%) between $T_0$ and $T_1$ is within 10(%) over the whole range of measurement wavelengths of from 400 to 700 nm, wherein $T_1$ is the light transmittance (%) of the light-transmitting region measured at the measurement wavelength $\lambda$ after dipping in a KOH aqueous solution at pH 11 for 24 hours and $T_0$ is the light-transmittance (%) measured at the measurement wavelength $\lambda$ before the dipping.

Another aspect of the invention relates to a polishing pad having a polishing region and a light-transmitting region used in chemical mechanical polishing, wherein the light-transmitting region satisfies that the difference $\Delta T$ ($\Delta T = T_0 - T_1$) (%) between $T_0$ and $T_1$ is within 10(%) over the whole range of measurement wavelengths of from 400 to 700 nm, wherein $T_1$ is the light transmittance (%) of the light-transmitting region measured at the measurement wavelength $\lambda$ after dipping in an $H_2O_2$ aqueous solution at pH 4 for 24 hours and $T_0$ is the light-transmittance (%) measured at the measurement wavelength $\lambda$ before the dipping.

As the intensity of a light passing through the light-transmitting region of the polishing pad is decayed less, the accuracy of detection of polishing end-point and the accuracy of measurement of film thickness can be increased. Accordingly, the degree of light transmittance at the wavelength of a measurement light used is important for determining the accuracy of detection of polishing end-point and the accuracy of measurement of film thickness.

The light-transmitting region of the present invention is excellent in alkali resistance as is evidenced by the fact that the difference in light transmittance before and after dipping in the KOH aqueous solution, that is, the difference $\Delta T$ (%) [$\Delta T$=(light-transmittance $T_0$ before dipping)−(light-transmittance $T_1$ after dipping)], is within 10(%) over the whole range of measurement wavelengths of from 400 to 700 nm, and therefore, the light-transmitting region is sufficiently durable even when repeatedly used with alkaline slurry for use in polishing. Accordingly, the light-transmitting region can maintain high-precision end-point optical detection over a long period from the start of use to the end of use without gradually turning turbid or deterioration. The above-mentioned $\Delta T$ (%) is preferably within 9(%). When the $\Delta T$ (%) is greater than 10(%), the transparency of the light-transmitting region is gradually decreased upon contact with alkaline slurry, thus failing to maintain high-precision end-point optical detection over a long period.

Another light-transmitting region of the present invention is excellent in acid resistance as is evidenced by the fact that the difference in light transmittance before and after dipping in the $H_2O_2$ aqueous solution, that is, the difference $\Delta T$ (%) [$\Delta T$=(light-transmittance $T_0$ before dipping)−(light-transmittance $T_1$ after dipping)] is within 10(%) over the whole range of measurement wavelengths of from 400 to 700 nm, and therefore, the light-transmitting region is sufficiently durable even when repeatedly used with acidic slurry for use in polishing. Accordingly, the light-transmitting region can maintain high-precision end-point optical detection over a long period from the start of use to the end of use without gradually turning turbid or deterioration. The above-mentioned $\Delta T$ (%) is preferably within 9(%), particularly preferably 5(%). When the $\Delta T$ (%) is greater than 10(%), the transparency of the light-transmitting region is gradually decreased upon contact with acidic slurry, thus failing to maintain high-precision end-point optical detection over a long period.

The light transmittance of the light-transmitting region in the present invention is the transmittance of the light-transmitting region having a thickness of 1 mm or a thickness converted to 1 mm. Generally, the transmittance is changed depending on the thickness of the light-transmitting region, according to the Lambert-Beer law. Because the transmittance is decreased as the thickness is increased, the transmittance of the light-transmitting region with its thickness fixed should be determined.

In the present invention, the material for forming the light-transmitting region is preferably non-foam. When the material is non-foam, light scattering can be suppressed so that accurate reflectance can be detected to improve the accuracy of optical detection of the end-point of polishing.

The surface of the light-transmitting region at the polishing side does not preferably have an uneven structure for retaining and renewing an abrasive liquid. When macroscopic surface unevenness is present on the surface of the light-transmitting region at the polishing side, slurry containing additives such as abrasive grains tends to be retained in its concave portions to cause light scattering and absorption to exert influence on detection accuracy. Preferably, the other surface of the light-transmitting region does not have macroscopic surface unevenness, either. This is because when macroscopic surface unevenness is present, light scattering easily occurs, which may exert influence on detection accuracy.

In the present invention, the material for forming the polishing region is preferably fine-cell foam.

Preferably, the surface of the polishing region at the polishing side is provided with grooves.

Also, the average cell diameter of the fine-cell foam is preferably 70 μm or less, more preferably 50 μm or less. When the average cell diameter is 70 μm or less, planarity is improved.

The specific gravity of the fine-cell foam is preferably 0.5 to 1.0, more preferably 0.7 to 0.9. When the specific gravity is less than 0.5, the strength of the surface of the polishing region is lowered to reduce the planarity of an object of polishing, while when the specific gravity is higher than 1.0, the number of fine cells on the surface of the polishing region is decreased, and planarity is good, but the rate of polishing tends to be decreased.

The hardness of the fine-cell foam is preferably 35 to 65 degrees, more preferably 35 to 60 degrees, in terms of Asker D hardness. When the Asker D hardness is less than 35 degrees, the planarity of an object of polishing is decreased, while when the planarity is greater than 65 degrees, the planarity is good, but the uniformity of an object of polishing tends to be decreased.

The compressibility of the fine-cell foam is preferably 0.5 to 5.0%, more preferably 0.5 to 3.0%. When the compressibility is in this range, both planarity and uniformity can be satisfied. The compressibility is a value calculated from the following equation.

Compressibility (%)=$\{(T1-T2)/T1\} \times 100$

T1: the thickness of fine-cell foam after the fine-cell foam in a non-loaded state is loaded with a stress of 30 kPa (300 g/cm$^2$) for 60 seconds.

T2: the thickness of the fine-cell foam after the fine-cell foam allowed to be in the T1 state is loaded with a stress of 180 kPa (1800 g/cm$^2$) for 60 seconds.

The compression recovery of the fine-cell foam is preferably 50 to 100%, more preferably 60 to 100%. When the compression recovery is less than 50%, the thickness of the polishing region is significantly changed as loading during polishing is repeatedly applied onto the polishing region, and the stability of polishing characteristics tends to be lowered. The compression recovery is a value calculated from the following equation.

Compression recovery (%)=$[(T3-T2)/(T1-T2)] \times 100$

T1: the thickness of fine-cell foam after the fine-cell foam in a non-loaded state is loaded with a stress of 30 kPa (300 g/cm$^2$) for 60 seconds.

T2: the thickness of the fine-cell foam after the fine-cell foam after allowed to be in the T1 state is loaded with a stress of 180 kPa (1800 g/cm$^2$) for 60 seconds.

T3: the thickness of the fine-cell foam after the fine-cell foam after allowed to be in the T2 state is kept without loading for 60 seconds and then loaded with a stress of 30 kPa (300 g/cm$^2$) for 60 seconds.

The storage elastic modulus of the fine-cell foam at 40° C. at 1 Hz is preferably 150 MPa or more, more preferably 250 MPa or more. When the storage elastic modulus is less than 150 MPa, the strength of the surface of the polishing region is lowered and the planarity of an object of polishing tends to be reduced. The storage elastic modulus refers to the elastic modulus determined by measuring the fine-cell foam by applying sinusoidal wave vibration with a tensile testing jig in a dynamic viscoelastometer.

The invention relate to a method of manufacturing a semiconductor device, which comprises a step of polishing the surface of a semiconductor wafer with the polishing pad described above.

BEST MODE FOR CARRYING OUT THE INVENTION

Figure 1:
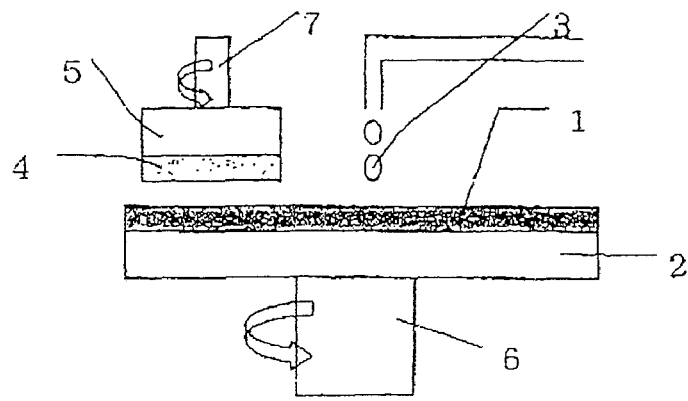
FIG. 1 is a schematic illustration showing one example of a conventional polishing apparatus used in CMP polishing.

The polishing pad of the present invention has at least a polishing region and a light-transmitting region.

The difference $\Delta T$ ($\Delta T = T_0 - T_1$) (%) in the light-transmitting region between the light transmittance $T_1$ (%) at the measurement wavelength $\lambda$ after dipping in a KOH aqueous solution at pH 11 for 24 hours and the light transmittance $T_0$ (%) at the measurement wavelength $\lambda$ before the dipping should be within 10(%) over the whole range of measurement wavelengths of from 400 to 700 nm.

The difference $\Delta T$ (%) in another light-transmitting region between the light transmittance $T_1$ (%) at the measurement wavelength $\lambda$ after dipping in an $H_2O_2$ aqueous solution at pH 4 for 24 hours and the light transmittance $T_0$ (%) at the measurement wavelength $\lambda$ before the dipping should be within 10(%) over the whole range of measurement wavelengths of from 400 to 700 nm.

The material for forming the light-transmitting region includes, for example, polyurethane resin, polyester resin, polyamide resin, acrylic resin, polycarbonate resin, halogenated resin (polyvinyl chloride, polytetrafluoroethylene, polyvinylidene fluoride etc.), polystyrene, olefinic resin (polyethylene, polypropylene etc.), epoxy resin and photosensitive resin. These may be used alone or as a mixture of two or more thereof.

As a means for reducing the difference between the light transmittance before dipping in a KOH aqueous solution at pH 11 or an $H_2O_2$ aqueous solution at pH 4 and the light transmittance after the dipping, a method of enhancing the durability of the material used in the light-transmitting region to the alkaline or acidic aqueous solution is conceivable. When a material poor in durability to the alkaline or acidic aqueous solution is used, the deterioration of the material starts at the surface thereof, to decrease light transmittance.

It is preferable to use the forming material used in the polishing region and a material having physical properties similar to those of the polishing region. Particularly, polyurethane resin having high abrasion resistance capable of suppressing the light scattering of the light-transmitting region due to dressing trace during polishing is desirable.

The polyurethane resin comprises an organic isocyanate, a polyol (a high-molecular-weight polyol, a low-molecular-weight polyol) and a chain extender.

The organic isocyanate includes 2,4-toluene diisocyanate, 2,6-toluene diisocyanate, 2,2'-diphenylmethane diisocyanate, 2,4'-diphenylmethane diisocyanate, 4,4'-diphenylmethane diisocyanate, 1,5-naphthalene diisocyanate, p-phenylene diisocyanate, m-phenylene diisocyanate, p-xylylene diisocyanate, m-xylylene diisocyanate, hexamethylene diisocyanate 1,4-cyclohexan diisocyanate, 4,4'-dicyclohexylmethane diisocyanate, isophorone diisocyanate etc. These may be used alone or as a mixture of two or more thereof.

The usable organic isocyanate includes not only the isocyanate compounds described above but also multifunctional (trifunctional or more) polyisocyanate compounds. As the multifunctional isocyanate compounds, Desmodule-N (manufactured by Bayer Ltd.) and a series of diisocyanate adduct compounds under the trade name of Duranate (Asahi Kasei Corporation) are commercially available. Because the trifunctional or more polyisocyanate compound, when used singly in synthesizing a prepolymer, is easily gelled, the polyisocyanate compound is used preferably by adding it to the diisocyanate compound.

The high-molecular-weight polyol includes polyether polyols represented by polytetramethylene ether glycol, polyester polyols represented by polybutylene adipate, polyester polycarbonate polyols exemplified by reaction products of polyester glycols such as polycaprolactone polyol and polycaprolactone with alkylene carbonate, polyester polycarbonate polyols obtained by reacting ethylene carbonate with a multivalent alcohol and reacting the resulting reaction mixture with an organic dicarboxylic acid, and polycarbonate polyols obtained by ester exchange reaction of a polyhydroxyl compound with aryl carbonate. Particularly, polyether polyol, polycaprolactone polyol, polyester polycarbonate polyol etc. are preferably used in order to improve durability to an alkaline aqueous solution or an acidic aqueous solution. When a glycol adipate-based material having a short methylene chain is used, this material is preferably copolymerized with an aromatic acid. For improving light transmittance, a high-molecular-weight polyol not having a long resonance structure, or a high-molecular-weight polyol hardly having a skeleton structure having highly electron-attracting properties/electron-donating properties, is preferably used. These may be used alone or as a mixture of two or more thereof.

The polyol includes not only the above high-molecular-weight polyols but also low-molecular-weight polyols such as ethylene glycol, 1,2-propylene glycol, 1,3-propylene glycol, 1,4-butane diol, 1,6-hexane diol, neopentyl glycol, 1,4-cyclohexane dimethanol, 3-methyl-1,5-pentane diol, diethylene glycol, triethylene glycol, 1,4-bis(2-hydroxyethoxy) benzene etc.

The chain extender includes low-molecular-weight polyols such as ethylene glycol, 1,2-propylene glycol, 1,3-propylene glycol, 1,4-butane diol, 1,6-hexane diol, neopentyl glycol, 1,4-cyclohexane dimethanol, 3-methyl-1,5-pentane diol, diethylene glycol, triethylene glycol, 1,4-bis(2-hydroethoxy) benzene etc., and polyamines such as 2,4-toluene diamine, 2,6-toluene diamine, 3,5-diethyl-2,4-toluene diamine, 4,4'-di-sec-butyl-diaminodiphenyl methane, 4,4'-diaminodiphenyl methane, 3,3'-dichloro-4,4'-diaminodiphenyl methane, 2,2',3,3'-tetrachloro-4,4'-diaminodiphenyl methane, 4,4'-diamino-3,3'-diethyl-5,5'-dimethyl diphenyl methane, 3,3'-diethyl-4,4'-diaminodiphenyl methane, 4,4'-methylene-bis-methyl anthranylate, 4,4'-methylene-bis-anthranylic acid, 4,4'-diaminodiphenyl sulfone, N,N'-di-sec-butyl-p-phenylene diamine, 4,4'-methylene-bis(3-chloro-2,6-diethylamine), 3,3'-dichloro-4,4'-diamino-5,5'-diethyl diphenyl methane, 1,2-bis(2-aminophenylthio) ethane, trimethylene glycol-di-p-aminobenzoate, 3,5-bis(methylthio)-2,4-toluene diamine etc. These may be used singly or as a mixture of two or more thereof. However, the polyamine is often colored by itself, and resin using the same is also colored, and thus the polyamine is blended preferably in such a range that the physical properties and light transmittance are not deteriorated. When the compound having an aromatic hydrocarbon group is used, the light transmittance in the short-wavelength side tends to be decreased, and thus such compound is preferably not used. A compound having an electron-donating group or an electron-withdrawing group, such as a halogen group or a thio group, bound to an aromatic ring etc. tends to lower light transmittance, and thus such a compound is particularly preferably not used. However, such a compound may be incorporated to such an extent that the light transmittance required at the short wavelength side is not deteriorated.

The proportion of the organic isocyanate, the polyol and the chain extender in the polyurethane resin can be changed suitably depending on their respective molecular weights, desired physical properties of the light-transmitting region produced therefrom, etc. To allow the light-transmitting region to achieve the above properties, the ratio of the number of isocyanate groups of the organic isocyanate to the number of functional groups in total (hydroxyl group+amino group) in the polyol and the chain extender is preferably 0.95 to 1.15, more preferably 0.99 to 1.10.

The polyurethane resin can be polymerized by known urethane-making techniques such as a melting method, a solution method etc., but in consideration of cost and working atmosphere, the polyurethane resin is formed preferably by the melting method.

The polyurethane resin can be produced by a prepolymer method or a one-shot method, but the prepolymer method wherein an isocyanate-terminated prepolymer synthesized previously from an organic isocyanate and a polyol is reacted with a chain extender is generally used. When a commercially available isocyanate-terminated prepolymer produced from an organic isocyanate and a polyol can be adapted to the present invention, the commercial product can be used in the prepolymer method, to polymerize the polyurethane used in the present invention.

The method of preparing the light-transmitting region is not particularly limited, and the light-transmitting region can be prepared according to methods known in the art. For example, a method wherein a block of polyurethane resin produced by the method described above is cut in a predetermined thickness by a slicer in a handsaw system or a planing system, a method that involves casting resin into a mold having a cavity of predetermined thickness and then curing the resin, a method of using coating techniques and sheet molding techniques, etc. are used. When there are bubbles in the light-transmitting region, the decay of reflected light becomes significant due to light scattering, thus reducing the accuracy of detection of polishing end-point and the accuracy of measurement of film thickness. Accordingly, gas contained in the material before mixing is sufficiently removed under reduced pressure at 10 Torr or less. In the case of a usually used stirring blade mixer, the mixture is stirred at a revolution number of 100 rpm or less so as not to permit bubbles to be incorporated into it in the stirring step after mixing. The stirring step is also preferably conducted under reduced pressure. When a rotating mixer is used, bubbles are hardly mixed even in high rotation, and thus a method of stirring and defoaming by using this mixer is also preferable.

The shape and size of the light-transmitting region are not particularly limited, but are preferably similar to the shape and size of the opening of the polishing region.

The thickness of the light-transmitting region is preferably 0.5 to 4 mm, more preferably 0.6 to 3.5 mm. This is because the thickness of the light-transmitting region is preferably equal to, or smaller than, the thickness of the polishing region. When the light-transmitting region is thicker than the polishing region, an object of polishing may be damaged by its raised region during polishing. On the other hand, when the light-transmitting region is too thin, durability is insufficient.

A generally used polishing device uses a laser having an oscillation wavelength in the vicinity of 500 to 700 nm, so the light transmittance in this wavelength region is preferably 80% or more. In this case, highly reflected light is obtained, and the accuracy of detection of end-point and the accuracy of detection of film thickness can be improved. The light transmittance in this wavelength region is preferably 90% or more.

As the means by which the light transmittance over the whole range of wavelengths of 500 to 700 nm in the light transmittance range is increased to 80% or more, it is preferable that the structure of each resin is free from a skeleton having an absorption band towards lights of wavelengths of 500 to 700 nm, and also that a resin having such skeleton is not incorporated to such a degree that the required light transmittance is deteriorated. Another means involves reducing the length of resonance through which electrons flow in the direction of a molecular chain in each resin. This is because even if a skeleton of each monomer constituting the resin does not have large absorption in the above wavelength region, each monomer upon polymerization to develop a resonance structure through which electrons flow in the direction of a molecular chain would bring about easy shifting of the light absorption zone of the resin towards the longer wavelength side. Accordingly, a preferable means involves inserting a skeleton cutting the resonance structure into the molecule. Another means involves reducing charge transfer among molecules. Accordingly, a resin consisting of a polymer chain containing a bending polymer chain, a polymer chain having bulky functional groups, or a polymer chain hardly containing a highly electron-withdrawing or electron-donating skeleton is preferably used.

The change rate in the light transmittance of the light-transmitting region in measurement wavelengths of 400 to 700 nm before dipping, represented by the following equation, is preferably 50 (%) or less, more preferably 25 (%) or less.

The change rate (%)={(maximum light transmittance in 400 to 700 nm−minimum light transmittance in 400 to 700 nm)/maximum light transmittance in 400 to 700 nm}×100

When the change rate in the light transmittance is greater than 50(%), the intensity of a light passing through the light-transmitting region is decayed significantly at the short wavelength side, and the amplitude of an interfering light is decreased, and the accuracy of detection of polishing end-point and the accuracy of measurement of film thickness tend to be decreased.

The light transmittance, at a measurement wavelength of 400 nm, of the light transmitting region before dipping is preferably 20% or more, more preferably 50% or more. When the light transmittance at a measurement wavelength of 400 nm is 20% or more, a laser having an oscillation wavelength in the vicinity of 400 to 700 nm can be used, and a larger number of wafer surface profiles can be obtained, and thus the accuracy of detection of polishing end-point and the accuracy of measurement of film thickness can be further improved.

The difference among the respective light transmittances, in measurement wavelengths of 500 to 700 nm, of the light-transmitting region before dipping is preferably 5(%) or less, more preferably 3(%) or less. When the difference among the light transmittances at the respective wavelengths is 5(%) or less, a wafer can be irradiated with constant incident light in spectrometrically analyzing the film thickness of the wafer, thus enabling calculation of accurate reflectance to improve detection accuracy.

The scatter of the thickness of the light-transmitting region is preferably 100 μm or less, more preferably 50 μm or less. When the scatter of the thickness is higher than 100 μm, large undulation is caused to generate portions different in a contacting state with an object of polishing, thus influencing polishing characteristics.

The method of suppressing the scatter of thickness includes a method of buffing the surface of a sheet having a predetermined thickness. Buffing is conducted preferably stepwise by using polishing sheets different in grain size. When the light-transmitting region is subjected to buffing, the surface roughness is preferably lower. When the surface roughness is high, incident light is irregularly reflected on the surface of the light-transmitting region, thus reducing transmittance and reducing detection accuracy.

The material for forming the polishing region can be used without particular limitation insofar as it is usually used as the material of a polishing layer, but in the present invention, fine-cell foam is preferably used. When the fine-cell foam is used, slurry can be retained on cells of the surface to increase the rate of polishing.

The material for forming the polishing region includes, for example, polyurethane resin, polyester resin, polyamide resin, acrylic resin, polycarbonate resin, halogenated resin (polyvinyl chloride, polytetrafluoroethylene, polyvinylidene fluoride etc.), polystyrene, olefinic resin (polyethylene, polypropylene etc.), epoxy resin, and photosensitive resin. These may be used alone or as a mixture of two or more thereof. The material for forming the polishing region may have a composition identical with, or different from, that of the light-transmitting region, but is preferably the same material as that of the light-transmitting region.

The polyurethane resin is a particularly preferable material because it is excellent in abrasion resistance and serves as a polymer having desired physical properties by changing the composition of its starting materials.

The polyurethane resin comprises an organic isocyanate, a polyol (a high-molecular-weight polyol, a low-molecular-weight polyol) and a chain extender.

The organic isocyanate used is not particularly limited, and for example, the organic isocyanate described above can be mentioned.

The polyol used is not particularly limited, and for example, the polyol described above can be mentioned. The number-average molecular weight of the polyol is not particularly limited, but is preferably about 500 to 2000, more preferably 500 to 1500, from the viewpoint of the elastic characteristics and the like of the resulting polyurethane. When the number-average molecular weight is less than 500, the polyurethane obtained therefrom does not have sufficient elastic characteristics, thus becoming a brittle polymer. Accordingly, a polishing pad produced from this polyurethane is rigid to cause scratch of the polished surface of an object of polishing. Further, because of easy abrasion, such polyurethane is not preferable from the viewpoint of the longevity of the pad. On the other hand, when the number-average molecular weight is higher than 2000, polyurethane obtained therefrom becomes soft, and thus a polishing pad produced from this polyurethane tends to be inferior in planarizing property.

As the polyol, the high-molecular-weight polyol can be used in combination with the low-molecular-weight polyol.

The ratio of the high-molecular-weight polyol to the low-molecular-weight polyol in the polyol is determined depending on characteristics required of the polishing region produced therefrom.

The chain extender includes polyamines such as 4,4'-methylene bis(o-chloroaniline), 2,6-dichloro-p-phenylene diamine, 4,4'-methylene bis(2,3-dichloroaniline) etc., or the above-described low-molecular-weight polyols. These may be used singly or as a mixture of two or more thereof.

The proportion of the organic isocyanate, the polyol and the chain extender in the polyurethane resin can be changed suitably depending on their respective molecular weights, desired physical properties of the polishing region produced therefrom, etc. To obtain the polishing region excellent in polishing characteristics, the ratio of the number of isocyanate groups of the organic isocyanate to the number of functional groups in total (hydroxyl group+amino group) in the polyol and the chain extender is preferably 0.95 to 1.15, more preferably 0.99 to 1.10.

The polyurethane resin can be produced by the same method as described above. A stabilizer such as an antioxidant etc., a surfactant, a lubricant, a pigment, a filler, an antistatic and other additives may be added if necessary to the polyurethane resin.

The method of finely foaming the polyurethane resin includes, but is not limited to, a method of adding hollow beads and a method of forming foam by mechanical foaming, chemical foaming etc. These methods can be simultaneously used, but the mechanical foaming method using an active hydrogen group-free silicone-based surfactant consisting of a polyalkyl siloxane/polyether copolymer is more preferable. As the silicone-based surfactant, SH-192 (Toray Dow Corning Silicone Co., Ltd.) can be mentioned as a preferable compound.

An example of the method of producing closed-cell polyurethane foam used in the polishing region is described below. The method of producing such polyurethane foam has the following steps.

(1) Stirring Step of Preparing a Cell Dispersion of an Isocyanate-Terminated Prepolymer A silicone-based surfactant is added to an isocyanate-terminated prepolymer and stirred in an inert gas, and the inert gas is dispersed as fine cells to form a cell dispersion. When the isocyanate-terminated prepolymer is in a solid form at ordinary temperatures, the prepolymer is used after melted by pre-heating to a suitable temperature.

(2) Step of Mixing a Curing Agent (Chain Extender)

A chain extender is added to, and mixed with, the cell dispersion under stirring.

(3) Curing Step

The isocyanate-terminated prepolymer mixed with the chain extender is cast in a mold and heat-cured.

The inert gas used for forming fine cells is preferably not combustible, and is specifically nitrogen, oxygen, a carbon dioxide gas, a rare gas such as helium and argon, and a mixed gas thereof, and the air dried to remove water is most preferable in respect of cost.

As a stirrer for dispersing the silicone-based surfactant-containing isocyanate-terminated prepolymer to form fine cells with the inert gas, known stirrers can be used without particular limitation, and examples thereof include a homogenizer, a dissolver, a twin-screw planetary mixer etc. The shape of a stirring blade of the stirrer is not particularly limited either, but a whipper-type stirring blade is preferably used to form fine cells.

In a preferable mode, different stirrers are used in stirring for forming a cell dispersion in the stirring step and in stirring for mixing an added chain extender in the mixing step, respectively. In particular, stirring in the mixing step may not be stirring for forming cells, and a stirrer not generating large cells is preferably used. Such a stirrer is preferably a planetary mixer. The same stirrer may be used in the stirring step and the mixing step, and stirring conditions such as revolution rate of the stirring blade are preferably regulated as necessary.

In the method of producing the polyurethane foam with fine cells, heating and post-curing of the foam obtained after casting and reacting the cell dispersion in a mold until the dispersion lost fluidity are effective in improving the physical properties of the foam, and are extremely preferable. The cell dispersion may be cast in a mold and immediately post-cured in a heating oven, and even under such conditions, heat is not immediately conducted to the reactive components, and thus the diameters of cells are not increased. The curing reaction is conducted preferably at normal pressures to stabilize the shape of cells.

In the production of the polyurethane resin, a known catalyst promoting polyurethane reaction, such as tertiary amine- or organotin-based catalysts, may be used. The type and amount of the catalyst added are determined in consideration of flow time in casting in a predetermined mold after the mixing step.

Production of the polyurethane foam may be in a batch system where each component is weighed out, introduced into a vessel and mixed or in a continuous production system where each component and an inert gas are continuously supplied to, and stirred in, a stirring apparatus and the resulting cell dispersion is transferred to produce molded articles.

The polishing region serving as a polishing layer is produced by cutting the above prepared polyurethane foam into a piece of predetermined size.

The polishing region consisting of fine-cell foam is preferably provided with grooves for retaining and renewing slurry on the surface of the polishing pad which contacts with an object of polishing. The polishing region composed of fine-cell foam has many openings to retain slurry, and for further efficient retention and renewal of slurry and for preventing the destruction of an object of polishing by adsorption, the polishing region preferably has grooves on the surface thereof in the polishing side. The shape of the grooves is not particularly limited insofar as slurry can be retained and renewed, and examples include latticed grooves, concentric circle-shaped grooves, through-holes, non-through-holes, polygonal prism, cylinder, spiral grooves, eccentric grooves, radial grooves, and a combination of these grooves. The groove pitch, groove width, groove thickness etc. are not particularly limited either, and are suitably determined to form grooves. These grooves are generally those having regularity, but the groove pitch, groove width, groove depth etc. can also be changed at each certain region to make retention and renewal of slurry desirable.

The method of forming grooves is not particularly limited, and for example, formation of grooves by mechanical cutting with a jig such as a bite of predetermined size, formation by casting and curing resin in a mold having a specific surface shape, formation by pressing resin with a pressing plate having a specific surface shape, formation by photolithography, formation by a printing means, and formation by a laser light using a $CO_2$ gas laser or the like.

Although the thickness of the polishing region is not particularly limited, the thickness is about 0.8 to 4 mm. The method of preparing the polishing region of this thickness includes a method wherein a block of the fine-cell foam is cut in predetermined thickness by a slicer in a bandsaw system or a planing system, a method that involves casting resin into a mold having a cavity of predetermined thickness and curing the resin, a method of using coating techniques and sheet molding techniques, etc.

The scatter of the thickness of the polishing region is preferably 100 µm or less, more preferably 50 µm or less. When the scatter of the thickness is higher than 100 µm, large undulation is caused to generate portions different in a contacting state with an object of polishing, thus adversely influencing polishing characteristics. To solve the scatter of the thickness of the polishing region, the surface of the polishing region is dressed generally in an initial stage of polishing by a dresser having abrasive grains of diamond deposited or fused thereon, but the polishing region outside of the range described above requires a longer dressing time to reduce the efficiency of production. As a method of suppressing the scatter of thickness, there is also a method of buffing the surface of the polishing region having a predetermined thickness. Buffing is conducted preferably stepwise by using polishing sheets different in grain size.

The method of preparing a polishing pad having the polishing region and the light-transmitting region is not particularly limited, and various methods are conceivable, and specific examples are described below. In the following specific examples, a polishing pad provided with a cushion layer is described, but the cushion layer may not be arranged in the polishing pad.

Figure 2:
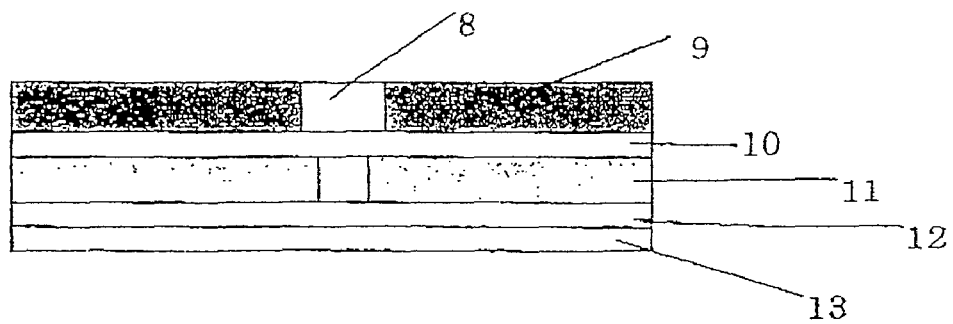
FIG. 2 is a schematic sectional view showing one example of the polishing pad of the present invention.

In a first example, as shown in FIG. 2, a polishing region 9 having an opening of specific size is stuck on a double-coated tape 10, and then a cushion layer 11 having an opening of specific size is stuck thereon such that its opening is in the same position as the opening of the polishing region 9. Then, a double-coated tape 12 provided with a release paper 13 is stuck on the cushion layer 11, and a light-transmitting region 8 is inserted into, and stuck on, the opening of the polishing region 9.

Figure 3:
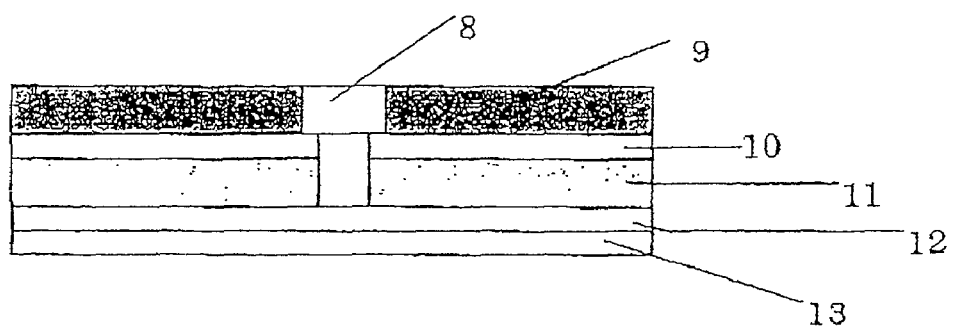
FIG. 3 is a schematic sectional view showing another example of the polishing pad of the present invention.

In a second example, as shown in FIG. 3, a polishing region 9 having an opening of specific size is stuck on a double-coated tape 10, and then a cushion layer 11 is stuck thereon. Thereafter, the double-coated tape 10 and the cushion layer 11 are provided with an opening of specific size so as to be fitted to the opening of the polishing region 9. Then, a double-coated tape 12 provided with a release paper 13 is stuck on the cushion layer 11, and a light-transmitting region 8 is inserted into, and stuck on, the opening of the polishing region 9.

Figure 4:
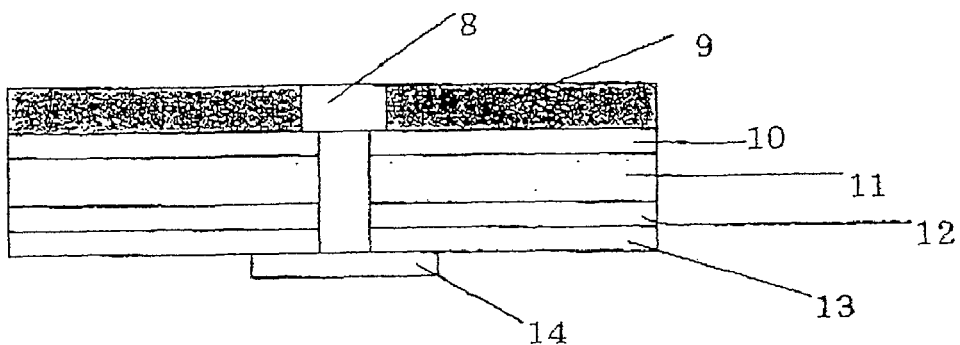
FIG. 4 is a schematic sectional view showing another example of the polishing pad of the present invention.

In a third example, as shown in FIG. 4, a polishing region 9 having an opening of specific size is stuck on a double-coated tape 10, and then a cushion layer 11 is stuck thereon. Then, a double-coated tape 12 provided with a release paper 13 is stuck on the other side of the cushion layer 11, and thereafter, an opening of predetermined size to be fitted to the opening of the polishing region 9 is produced from the double-coated tape 10 to the release paper 13. A light-transmitting region 8 is inserted into, and stuck on, the opening of the polishing region 9. In this case, the opposite side of the light-transmitting region 8 is open so that dust etc. may be accumulated, and thus a member 14 for closing it is preferably attached.

Figure 5:
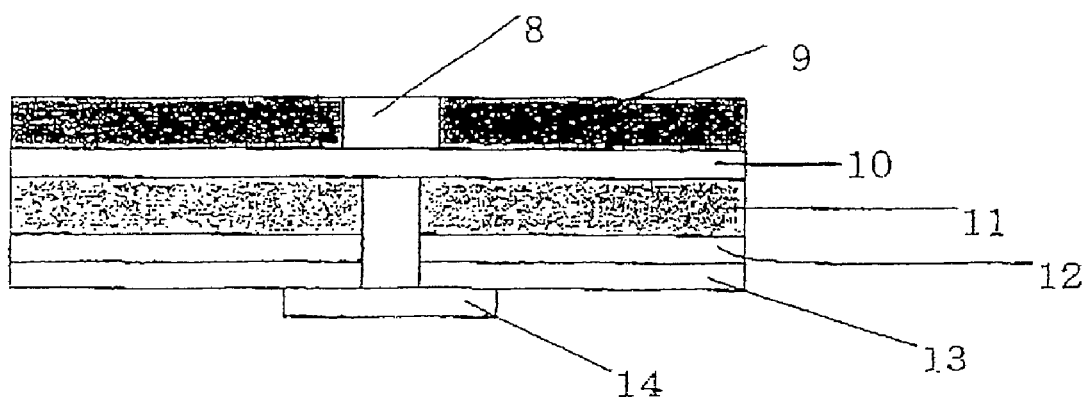
FIG. 5 is a schematic sectional view showing another example of the polishing pad of the present invention.
Figure 6:
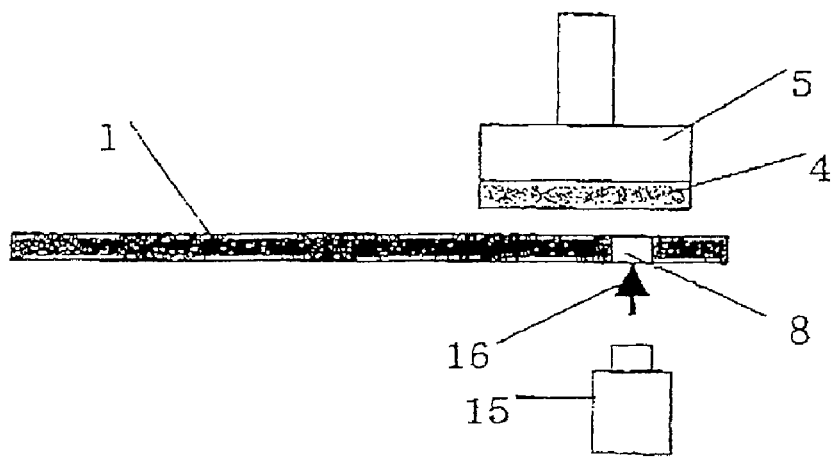
FIG. 6 is a schematic illustration showing one example of a CMP polishing apparatus having the end-point sensing apparatus of the present invention.

In a fourth example, as shown in FIG. 5, a cushion layer 11 having a double-coated tape 12 provided with a release paper 13 is provided with an opening of predetermined size. Then, a polishing region 9 having an opening of predetermined size is stuck on a double-coated tape 10 which is then stuck on the cushion layer 11 such that their openings are positioned in the same place. Then, a light-transmitting region 8 is inserted into, and stuck on, the opening of the polishing region 9. In this case, the opposite side of the polishing region is open so that dust etc. may be accumulated, and thus a member 14 for closing it is preferably attached.

In the method of preparing the polishing pad, the means of forming an opening in the polishing region and the cushion layer is not particularly limited, but for example, a method of opening by pressing with a jig having a cutting ability, a method of utilizing a laser such as a $CO_2$ laser, and a method of cutting with a jig such as a bite. The size and shape of the opening of the polishing region in the first and second inventions are not particularly limited.

The cushion layer compensates for characteristics of the polishing region (polishing layer). The cushion layer is required for satisfying both planarity and uniformity which are in a tradeoff relationship in chemical mechanical polishing (CMP). Planarity refers to flatness of a pattern region upon polishing an object of polishing having fine unevenness generated upon pattern formation, and uniformity refers to the uniformity of the whole of an object of polishing. Planarity is improved by the characteristics of the polishing layer, while uniformity is improved by the characteristics of the cushion layer. The cushion layer used in the polishing pad of the present invention is preferably softer than the polishing layer.

The material forming the cushion layer is not particularly limited, and examples of such material include a nonwoven fabric such as a polyester nonwoven fabric, a nylon nonwoven fabric or an acrylic nonwoven fabric, a nonwoven fabric impregnated with resin such as a polyester nonwoven fabric impregnated with polyurethane, polymer resin foam such as polyurethane foam and polyethylene foam, rubber resin such as butadiene rubber and isoprene rubber, and photosensitive resin.

The means of sticking the polishing layer used in the polishing region 9 on the cushion layer 11 includes, for example, a method of pressing the polishing region and the cushion layer having a double-coated tape therebetween.

The double-coated tape has a general constitution wherein an adhesive layer is arranged on both sides of a base material such as a nonwoven fabric or a film. In consideration of permeation of slurry into the cushion layer, a film is preferably used as the base material. The composition of the adhesive layer includes, for example, a rubber-based adhesive and an acrylic adhesive. In consideration of the content of metallic ion, the acrylic adhesive is preferable because of a lower content of metallic ion. Because the polishing region and the cushion layer can be different in composition, the composition of each adhesive layer of the double-coated tape can be different to make the adhesion of each layer suitable.

The means of sticking the cushion layer 11 on the double-coated tape 12 includes a method of sticking the double-coated tape by pressing on the cushion layer.

As described above, the double-coated tape has a general constitution wherein an adhesive layer is arranged on both sides of a base material such as a nonwoven fabric or a film. In consideration of removal of the polishing pad after use from a platen, a film is preferably used as the base material in order to solve a residual tape. The composition of the adhesive layer is the same as described above.

The member 14 is not particularly limited insofar as the opening is closed therewith. When polishing is conducted, it should be releasable.

The semiconductor device is produced by a step of polishing the surface of a semiconductor wafer by using the polishing pad. The semiconductor wafer generally comprises a wiring metal and an oxide film laminated on a silicon wafer. The method of polishing a semiconductor wafer and a polishing apparatus are not particularly limited, and as shown in FIG. 1, polishing is conducted for example by using a polishing apparatus including a polishing platen 2 for supporting a polishing pad 1, a supporting stand (polishing head) 5 for supporting a semiconductor wafer 4, a backing material for uniformly pressurizing the wafer, and a mechanism of feeding an abrasive 3. The polishing pad 1 is fitted, for example via a double-coated tape, with the polishing platen 2. The polishing platen 2 and the supporting stand 5 are provided with rotating shafts 6 and 7 and arranged such that the polishing pad 1 and the semiconductor wafer 4, both of which are supported by them, are arranged to be opposite to each other. The supporting stand 5 is provided with a pressurizing mechanism for pushing the semiconductor wafer 4 against the polishing pad 1. For polishing, the polishing platen 2 and the supporting stand 5 are rotated and simultaneously the semiconductor wafer 4 is polished by pushing it against the polishing pad 1 with slurry fed thereto. The flow rate of slurry, polishing loading, number of revolutions of the polishing platen, and number of revolutions of the wafer are not particularly limited and can be suitably regulated.

Protrusions on the surface of the semiconductor wafer 4 are thereby removed and polished flatly. Thereafter, a semiconductor device is produced therefrom through dicing, bonding, packaging etc. The semiconductor device is used in an arithmetic processor, a memory etc.

EXAMPLES

Hereinafter, the Examples illustrating the constitution and effect of the first to third inventions are described. Evaluation items in the Examples etc. were measured in the following manner.

(Measurement of Light Transmittance Before Dipping)

The prepared light-transmitting region member was cut out with a size of 2 cm×6 cm (thickness: arbitrary) to prepare a sample for measurement of light transmittance. Using a spectrophotometer (U-3210 Spectro Photometer, manufactured by Hitachi, Ltd.), the sample was measured in the range of measurement wavelengths of 400 to 700 nm. In the measurement result of light transmittance, light transmittance per mm thickness was expressed by using the Lambert-Beer law.

(Measurement of Light Transmittance After Dipping for 24 Hours in a KOH Aqueous Solution at pH 11 or in a $H_2O_2$ Aqueous Solution at pH 4)

The prepared light-transmitting region member was cut out with a size of 2 cm×6 cm (thickness: arbitrary) to prepare a sample for measurement of light transmittance, which was then dipped for 24 hours in a KOH aqueous solution adjusted to pH 11 (50 ml, 60° C.) or in a $H_2O_2$ aqueous solution adjusted to pH 4 (50 ml, 60° C.). Thereafter, the sample was removed to wipe off the aqueous solution on the surface and then measured in the range of measurement wavelengths of 400 to 700 nm by using the above spectrophotometer. In the measurement result of light transmittance, light transmittance per mm thickness was expressed by using the Lambert-Beer law.

(Calculation of the Difference ΔT (%) in Light Transmittance Before and After Dipping)

The difference ΔT (%) was calculated from the light transmittance $T_1$ (%) measured at the measurement wavelength λ after dipping for 24 hours in the KOH aqueous solution at pH 11 or in the $H_2O_2$ aqueous solution at pH 4 and the light-transmittance $T_0$ (%) measured at the measurement wavelength λ before the dipping. The measurement wavelength range was 400 to 700 nm, and the light transmittances at 700, 600, 500 and 400 nm as the measurement wavelength λ were used in evaluation.

$\Delta T(\%)$=(light transmittance $T_0$ before dipping)–(light transmittance $T_1$ after dipping)

(Measurement of Average Cell Diameter)

A polishing region cut parallel to be as thin as about 1 mm by a microtome cutter was used as a sample for measurement of average cell diameter. The sample was fixed on a slide glass, and the diameters of all cells in an arbitrary region of 0.2 mm×0.2 mm were determined by an image processor (Image Analyzer V10, manufactured by Toyobouseki Co., Ltd), to calculate the average cell diameter.

(Measurement of Specific Gravity)

Determined according to JIS Z8807-1976. A polishing region cut out in the form of a strip of 4 cm×8.5 cm (thickness: arbitrary) was used as a sample for measurement of specific gravity and left for 16 hours in an environment of a temperature of 23±2° C. and a humidity of 50%±5%. Measurement was conducted by using a specific gravity hydrometer (manufactured by Sartorius Co., Ltd).

(Measurement of Asker D Hardness)

Measurement is conducted according to JIS K6253-1997. A polishing region cut out in a size of 2 cm×2 cm (thickness: arbitrary) was used as a sample for measurement of hardness and left for 16 hours in an environment of a temperature of 23±2° C. and a humidity of 50%±5%. At the time of measurement, samples were stuck on one another to a thickness of 6 mm or more. A hardness meter (Asker D hardness meter, manufactured by Kobunshi Keiki Co., Ltd.) was used to measure hardness.

(Measurement of Compressibility, Compression Recovery)

A polishing region cut into a circle of 7 mm in diameter (thickness: arbitrary) was used as a sample for measurement of compressibility and compression recovery and left for 40 hours in an environment of a temperature of 23±2° C. and a humidity of 50%±5%. In measurement, a thermal analysis measuring instrument TMA (SS6000, manufactured by SEIKO INSTRUMENTS Inc.) to measure compressibility and compression recovery. Equations for calculating compressibility and compression recovery are shown below.

Compressibility (%)=$\{(T1-T2)/T1\} \times 100$

T1: the thickness of the polishing layer after the polishing layer in a non-loaded state is loaded with a stress of 30 kPa (300 g/cm$^2$) for 60 seconds.

T2: the thickness of the polishing layer after the polishing layer allowed to be in the T1 state is loaded with a stress of 180 kPa (1800 g/cm$^2$) for 60 seconds.

Compression recovery (%)=$\{(T3-T2)/(T1-T2)\} \times 100$

T1: the thickness of the polishing layer after the polishing layer in a non-loaded state is loaded with a stress of 30 kPa (300 g/cm$^2$) for 60 seconds.

T2: the thickness of the polishing layer after the polishing layer allowed to be in the T1 state is loaded with a stress of 180 kPa (1800 g/cm$^2$) for 60 seconds.

T3: the thickness of the polishing layer after the polishing layer after allowed to be in the T2 state is kept without loading for 60 seconds and then loaded with a stress of 30 kPa (300 g/cm$^2$) for 60 seconds.

(Measurement of Storage Elastic Modulus)

Measurement is conducted according to JIS K7198-1991. A polishing region cut into a 3 mm×40 mm strip (thickness: arbitrary) was used as a sample for measurement of dynamic viscoelasticity and left for 4 days in a 23° C. environment condition in a container with silica gel. The accurate width and thickness of each sheet after cutting were measured using a micrometer. For measurement, a dynamic viscoelasticity spectrometer (manufactured by Iwamoto Seisakusho, now IS Giken) was used to determine storage elastic modulus E'. Measurement conditions are as follows:

<Measurement Conditions>

Measurement temperature: 40° C.
Applied strain: 0.03%
Initial loading: 20 g
Frequency: 1 Hz (Film Thickness Detection Evaluation A)

The evaluation A in optical detection of film thickness of a wafer was conducted in the following manner. As a wafer, a 1 μm thermal-oxide film was deposited on an 8-inch silicone wafer, and the light-transmitting region (thickness: 1.25 mm) before dipping was arranged thereon. The film thickness was measured several times in the wavelength range of 400 to 700 nm by using an interference film thickness measuring instrument (manufactured by Otsuka Electronics Co., Ltd.). The result of calculated film thickness and the state of top and bottom of interference light at each wavelength were confirmed, and the film thickness detection of the light-transmitting region before dipping was evaluated under the following criteria. Thereafter, the light-transmission region after dipping was arranged and measured in the same manner as above. Then, the result was compared with that before dipping, and the change in film thickness detection before and after dipping in the KOH aqueous solution or H$_2$O$_2$ aqueous solution was evaluated under the following criteria.

Evaluation Before Dipping o: Film thickness is measured with very good reproducibility.

Δ: Film thickness is measured with good reproducibility.

x: Detection accuracy is insufficient with poor reproducibility.

Evaluation Before and After Dipping o: Film thickness is measured with good reproducibility before and after dipping.

x: Reproducibility is poor before and after dipping, and the detection accuracy of film thickness is deteriorated by dipping in the KOH aqueous solution or the H$_2$O$_2$ aqueous solution.

(Film Thickness Detection Evaluation B)

The evaluation B of optical detection of film thickness of a wafer was conducted in the following manner. As a wafer, a 1 μm thermal-oxide film was deposited on an 8-inch silicone wafer, and the light-transmitting region (thickness: 1.25 mm) before dipping was arranged thereon. The film thickness was measured several times at the wavelength of 633 nm with a He—Ne laser in an interference film thickness measuring instrument. The result of calculated film thickness and the state of top and bottom of interference light at each wavelength were confirmed, and the film thickness detection of the light-transmitting region before dipping was evaluated under the following criteria. Thereafter, the light-transmission region after dipping was arranged and measured in the same manner as above. Then, the result was compared with that before dipping, and the change in film thickness detection before and after dipping in the KOH aqueous solution or H$_2$O$_2$ aqueous solution was detected and evaluated under the following criteria.

Evaluation Before Dipping o: Film thickness is measured with good reproducibility.

x: Detection accuracy is insufficient with poor reproducibility.

Evaluation Before and After Dipping o: Film thickness is measured with good reproducibility before and after dipping.

x: Reproducibility is poor before and after dipping, and the detection accuracy of film thickness is deteriorated by dipping in the KOH aqueous solution or the H$_2$O$_2$ aqueous solution for evaluation.

(Evaluation of Polishing Characteristics)

The prepared polishing pad was used to evaluate polishing characteristics by using a polishing apparatus SPP600S (manufactured by Okamoto Machine Tool Works, Ltd.). An about 1 μm thermal-oxide film deposited on an 8-inch silicone wafer was polished by about 0.5 μm, and polishing rate was calculated from the time of this polishing. The thickness of the oxide film was measured by using an interference film thickness measuring instrument (manufactured by Otsuka Electronics Co., Ltd). During polishing, silica slurry (SS12 manufactured by Cabot) was added at a flow rate of 150 ml/min. Polishing loading was 350 g/cm$^2$, the number of revolutions of the polishing platen was 35 rpm, and the number of revolutions of the wafer was 30 rpm.

From measurement of in-plane film thickness at 28 points on the wafer polished as described above, the in-plane uniformity was calculated according to the following equation. Lower in-plane uniformity is indicative of higher uniformity.

$$\text{In-plane uniformity (\%)} = \{(\text{maximum film thickness} - \text{minimum film thickness})/(\text{maximum film thickness} + \text{minimum film thickness})\} \times 100$$

[Preparation of the Polishing Region]

14790 parts by weight of toluene diisocyanate (a mixture of toluene 2,4-diisocyanate/toluene 2,6-diisocyanate in a ratio of 80/20), 3930 parts by weight of 4,4'-dicyclohexyl methane diisocyanate, 25150 parts by weight of polytetramethylene glycol (number-average molecular weight, 1006; molecular weight distribution, 1.7) and 2756 parts by weight of diethylene glycol were mixed and heated at 80° C. for 120 minutes under stirring to prepare an isocyanate-terminated prepolymer (isocyanate equivalent: 2.1 meq/g). 100 parts by weight of this prepolymer after filtration and 3 parts by weight of a filtered silicone-based nonionic surfactant (SH192 manufactured by Toray Dow Corning Silicone Co., Ltd.) were mixed in a reaction container, and the temperature was regulated at 80° C. The mixture was stirred vigorously for about 4 minutes at a revolution number of 900 rpm by an agitating blade to incorporate bubbles into the reaction system. 26 parts by weight of filtered 4,4'-methylene bis(o-chloroaniline) previously melted at 120° C. (IHARA CUAMINE MT manufactured by Ihara Chemical Industry Co., Ltd.) were added thereto. Thereafter, the reaction solution was stirred for about 1 minute and poured into a pan-type open mold coated with fluorine. When the fluidity of this reaction solution was lost, the reaction solution was introduced into an oven and post-cured at 110° C. for 6 hours to give a polyurethane resin foam block. This polyurethane resin foam block was sliced by a bandsaw-type slicer (manufactured by Fecken) to give a polyurethane resin foam sheet. Then, this sheet was surface-buffed to predetermined thickness by a buffing machine (manufactured by Amitec) to give a sheet having regulated thickness accuracy (sheet thickness, 1.27 mm). This buffed sheet was cut into a round sheet having a predetermined diameter (61 cm) and provided with grooves in the form of concentric circles having a groove width of 0.25 mm, a groove pitch of 1.50 mm and a groove depth of 0.40 mm by using a grooving machine (manufactured by TohoKoki Co., Ltd.). A double-coated tape (Double Tack Tape, manufactured by Sekisui Chemical Co., Ltd.) was stuck by a laminator on the other side than the grooved surface of this sheet, and thereafter, a hole (thickness 1.27 mm, 57.5 mm×19.5 mm) for inserting a light-transmitting region into a predetermined position of the grooved sheet was punched out, to prepare a polishing region provided with the double-coated tape. Physical properties of the prepared polishing region were as follows: average cell diameter, 45 μm; specific gravity, 0.86; Asker D hardness, 53 degrees; compressibility, 1.0%; compression recovery, 65.0%; and storage elastic modulus, 275 MPa.

<Invention A: Alkali-Resistant>

[Preparation of the Light-Transmitting Region]

Production Example A-1

128 parts by weight of polyester polyol consisting of adipic acid, hexane diol and ethylene glycol (number-average molecular weight 2400) were mixed with 30 parts by weight of 1,4-butane diol, and the temperature of the mixture was regulated at 70° C. To this mixture was added 100 parts by weight of 4,4'-diphenylmethane diisocyanate previously regulated at a temperature of 70° C., and the mixture was stirred for about 1 minute. The mixture was poured into a container kept at 100° C. and post-cured at 100° C. for 8 hours to prepare polyurethane resin. The prepared polyurethane resin was used to prepare a light-transmitting region (length 57 mm, width 19 mm, thickness 1.25 mm) by injection molding.

Production Example A-2

A light-transmitting region (length 57 mm, width 19 mm and thickness 1.25 mm) was prepared in the same manner as in Production Example A-1 except that 89 parts by weight of polyester polyol consisting of adipic acid, hexane diol and ethylene glycol (number-average molecular weight 2000) was used, and the amount of 1,4-butane diol added was changed to 31 parts by weight.

Production Example A-3

A light-transmitting region (length 57 mm, width 19 mm and thickness 1.25 mm) was prepared in the same manner as in Production Example A-1 except that 75 parts by weight of polytetramethylene glycol (number-average molecular weight 890) were used in place of the polyester polyol, and the amount of 1,4-butane diol added was changed to 28 parts by weight.

Production Example A-4

A light-transmitting region (length 57 mm, width 19 mm and thickness 1.25 mm) was prepared in the same manner as in Production Example A-1 except that 120 parts by weight of polycaprolactone polyol (number-average molecular weight 2000) was used in place of the polyester polyol, and the amount of 1,4-butane diol added was changed to 31 parts by weight.

Production Example A-5

14790 parts by weight of toluene diisocyanate (a mixture of toluene 2,4-diisocyanate/toluene 2,6-diisocyanate in a ratio of 80/20), 3930 parts by weight of 4,4'-dicyclohexyl methane diisocyanate, 25150 parts by weight of polytetramethylene glycol (number-average molecular weight, 1006; molecular weight distribution 1.7) and 2756 parts by weight of diethylene glycol were introduced into a reaction container and heated at 80° C. for 120 minutes under stirring to prepare an isocyanate-terminated prepolymer (isocyanate equivalent: 2.1 meq/g). 100 parts by weight of this prepolymer was measured out in a vacuum tank, and gas remaining in the prepolymer was removed under reduced pressure (about 10 Torr). 29 parts by weight of 4,4'-methylene-bis(o-chloroaniline) previously melted at 120° C. was added to the above degassed prepolymer which was then stirred at a revolution number of 800 rpm for about 3 minutes with a revolving and rotating mixer (manufactured by Thinky Corporation). Then, the mixture was poured into a mold and post-cured for 9 hours in an oven at 110° C. to prepare a polyurethane resin sheet. Thereafter, both sides of the polyurethane resin sheet were polished with a buff to prepare a light-transmitting region (length 57 mm, width 19 mm, thickness 1.25 mm).

Production Example A-6

A light-transmitting region (length 57 mm, width 19 mm and thickness 1.25 mm) was prepared in the same manner as in Production Example A-1 except that 120 parts by weight of polyester polyol consisting of adipic acid and ethylene glycol (number-average molecular weight 2000) was used in place of the polyester polyol consisting of adipic acid, hexane diol and ethylene glycol, and the amount of 1,4-butane diol added was changed to 31 parts by weight.

Production Example A-7

A light-transmitting region (length 57 mm, width 19 mm and thickness 1.25 mm) was prepared in the same manner as in Production Example A-5 except that 3778 parts by weight of 4,4'-diisocyanate diphenyl ether were used in place of 4,4'-dicyclohexyl methane diisocyanate.

[Preparation of the Polishing Pad]

Example A-1

A cushion layer consisting of polyethylene foam (Toraypef, thickness of 0.8 mm, manufactured by Toray Industries, Inc.) having a surface brushed with a buff and subjected to corona treatment was stuck by a laminator on the pressure-sensitive adhesive surface of the double-coated tape provided with the polishing region. Further, the double-coated tape was stuck on the surface of the cushion layer. Thereafter, the cushion layer was punched out with a size of 51 mm×13 mm in the punched hole of the polishing region for inserting a light-transmitting region, to penetrate the hole. Thereafter, the light-transmitting region prepared in Production Example A-1 was inserted into the hole to prepare a polishing pad. The physical properties etc. of the prepared polishing pad are shown in Table 1.

Example A-2

A polishing pad was prepared in the same manner as in Example A-1 except that the light-transmitting region prepared in Production Example A-2 was used. The physical properties etc. of the prepared polishing pad are shown in Table 1.

Example A-3

A polishing pad was prepared in the same manner as in Example A-1 except that the light-transmitting region prepared in Production Example A-3 was used. The physical properties etc. of the prepared polishing pad are shown in Table 1.

Example A-4

A polishing pad was prepared in the same manner as in Example A-1 except that the light-transmitting region prepared in Production Example A-4 was used. The physical properties etc. of the prepared polishing pad are shown in Table 1.

Reference Example A-1

A polishing pad was prepared in the same manner as in Example A-1 except that the light-transmitting region prepared in Production Example A-5 was used. The physical properties etc. of the prepared polishing pad are shown in Table 1.

Comparative Example A-1

A polishing pad was prepared in the same manner as in Example A-1 except that the light-transmitting region prepared in Production Example A-6 was used. The physical properties etc. of the prepared polishing pad are shown in Table 1.

Reference Example A-2

A polishing pad was prepared in the same manner as in Example A-1 except that the light-transmitting region prepared in Production Example A-7 was used. The physical properties etc. of the prepared polishing pad are shown in Table 1.

TABLE 1

| | | Example A-1 | Example A-2 | Example A-3 | Example A-4 | Reference Example A-1 | Comparative Example A-1 | Reference Example A-2 |
|---|---|---|---|---|---|---|---|---|
| Light transmittance (%) before dipping in KOH aqueous solution | 700 nm | 94.2 | 94.1 | 93.2 | 93.4 | 93.6 | 95.1 | 40.2 |
| | 600 nm | 95.0 | 94.8 | 94.0 | 94.1 | 93.1 | 95.3 | 37.1 |
| | 500 nm | 94.9 | 94.8 | 93.7 | 93.5 | 89.2 | 94.8 | 29.9 |
| | 400 nm | 83.1 | 75.9 | 51.4 | 71.2 | 27.3 | 85.1 | 9.8 |
| Light transmittance (%) after dipping in KOH aqueous solution | 700 nm | 86.1 | 86.5 | 85.9 | 90.1 | 89.5 | 83.5 | 37.8 |
| | 600 nm | 87.0 | 87 | 87.6 | 90.5 | 90.6 | 82.5 | 33.8 |
| | 500 nm | 86.9 | 85.6 | 87.3 | 90.2 | 84.5 | 81.0 | 26.9 |
| | 400 nm | 78.8 | 73.9 | 42.5 | 66.4 | 22.4 | 68.3 | 6.5 |
| ΔT(%) | 700 nm | 8.1 | 7.6 | 7.3 | 3.3 | 4.1 | 11.6 | 2.4 |
| | 600 nm | 8.0 | 7.8 | 6.4 | 3.6 | 2.5 | 12.8 | 3.3 |
| | 500 nm | 8.0 | 8.7 | 6.4 | 3.3 | 4.7 | 13.8 | 3.0 |
| | 400 nm | 4.3 | 2.0 | 8.9 | 4.8 | 4.9 | 16.8 | 3.3 |
| Maximum light transmittance (%) at 400 to 700 nm | | 95.6 | 95.0 | 94.9 | 94.1 | 93.9 | 95.4 | 40.2 |
| Minimum light transmittance (%) at 400 to 700 nm | | 83.3 | 75.8 | 49.9 | 71.2 | 27.5 | 85.1 | 9.8 |
| Change rate (%) in light transmittance | | 12.9 | 20.0 | 47.4 | 24.3 | 70.7 | 10.8 | 75.6 |
| Film thickness detection evaluation A | Before dipping | ○ | ○ | ○ | ○ | Δ | ○ | x |
| | Before and after dipping | ○ | ○ | ○ | ○ | ○ | x | ○ |
| Film thickness detection evaluation B | Before dipping | ○ | ○ | ○ | ○ | ○ | ○ | x |
| | Before and after dipping | ○ | ○ | ○ | ○ | ○ | x | ○ |
| Polishing speed (Å/min) | | 2300 | 2350 | 2350 | 2300 | 2300 | 2300 | 2350 |
| In-plane uniformity (%) | | 9 | 10 | 8 | 9 | 8 | 9 | 9 |

As can be seen from Table 1, when ΔT is within 10% (Examples A-1 to A-4, Reference Example A-1), high-precision end-point optical detection can be continuously maintained over a long period even if polishing is performed with alkaline slurry. When ΔT is over 10% (Comparative Example A-1), high-precision end-point optical detection cannot be continuously maintained over a long period if polishing is performed with alkaline slurry. When the light transmittance over the range of wavelengths of 500 to 700 nm is less than 80% (Reference Example A-2), the detection accuracy of film thickness is not sufficient.

<Invention B: Acid-Resistant>

[Preparation of the Light-Transmitting Region]

Production Example B-1

128 parts by weight of polyester polyol consisting of adipic acid, hexane diol and ethylene glycol (number-average molecular weight 2050) were mixed with 30 parts by weight of 1,4-butane diol, and the temperature of the mixture was regulated at 70° C. To this mixture was added 100 parts by weight of 4,4'-diphenylmethane diisocyanate previously regulated at a temperature of 70° C., and the mixture was stirred for about 1 minute. The mixture was poured into a container kept at 100° C. and post-cured at 100° C. for 8 hours to prepare polyurethane resin. The prepared polyurethane resin was used to prepare a light-transmitting region (length 57 mm, width 19 mm, thickness 1.25 mm) by injection molding.

Production Example B-2

A light-transmitting region (length 57 mm, width 19 mm and thickness 1.25 mm) was prepared in the same manner as in Production Example B-1 except that 89 parts by weight of polyester polyol consisting of adipic acid, hexane diol and ethylene glycol (number-average molecular weight 1720) was used, and the amount of 1,4-butane diol added was changed to 31 parts by weight.

Production Example B-3

A light-transmitting region (length 57 mm, width 19 mm and thickness 1.25 mm) was prepared in the same manner as in Production Example B-1 except that 75 parts by weight of polytetramethylene glycol (number-average molecular weight 890) were used in place of the polyester polyol, and the amount of 1,4-butane diol added was changed to 28 parts by weight.

Production Example B-4

A light-transmitting region (length 57 mm, width 19 mm and thickness 1.25 mm) was prepared in the same manner as in Production Example B-1 except that 120 parts by weight of polycaprolactone polyol (number-average molecular weight 2000) was used in place of the polyester polyol, and the amount of 1,4-butane diol added was changed to 31 parts by weight.

Production Example B-5

14790 parts by weight of toluene diisocyanate (a mixture of toluene 2,4-diisocyanate/toluene 2,6-diisocyanate in a ratio of 80/20), 3930 parts by weight of 4,4'-dicyclohexyl methane diisocyanate, 25150 parts by weight of polytetramethylene glycol (number-average molecular weight, 1006; molecular weight distribution 1.7) and 2756 parts by weight of diethylene glycol were introduced into a reaction container and heated at 80° C. for 120 minutes under stirring to prepare an isocyanate-terminated prepolymer (isocyanate equivalent: 2.1 meq/g). 100 parts by weight of this prepolymer was measured out in a vacuum tank, and gas remaining in the prepolymer was removed under reduced pressure (about 10 Torr). 29 parts by weight of 4,4'-methylene-bis(o-chloroaniline) previously melted at 120° C. was added to the above degassed prepolymer which was then stirred at a revolution number of 800 rpm for about 3 minutes with a revolving and rotating mixer (manufactured by Thinky Corporation). Then, the mixture was poured into a mold and post-cured for 9 hours in an oven at 110° C. to prepare a polyurethane resin sheet. Thereafter, both sides of the polyurethane resin sheet were polished with a buff to prepare a light-transmitting region (length 57 mm, width 19 mm, thickness 1.25 mm).

Production Example B-6

A light-transmitting region (length 57 mm, width 19 mm and thickness 1.25 mm) was prepared in the same manner as in Production Example B-1 except that 120 parts by weight of polyester polyol consisting of adipic acid and ethylene glycol (number-average molecular weight 2000) was used in place of the polyester polyol consisting of adipic acid, hexane diol and ethylene glycol, and the amount of 1,4-butane diol added was changed to 31 parts by weight.

Production Example B-7

A light-transmitting region (length 57 mm, width 19 mm and thickness 1.25 mm) was prepared in the same manner as in Production Example B-5 except that 3778 parts by weight of 4,4'-diisocyanate diphenyl ether were used in place of 4,4'-dicyclohexyl methane diisocyanate.

[Preparation of the Polishing Pad]

Example B-1

A cushion layer consisting of polyethylene foam (Toraypef, thickness of 0.8 mm, manufactured by Toray Industries, Inc.) having a surface brushed with a buff and subjected to corona treatment was stuck by a laminator on the pressure-sensitive adhesive surface of the double-coated tape provided with the polishing region. Further, the double-coated tape was stuck on the surface of the cushion layer. Thereafter, the cushion layer was punched out with a size of 51 mm×13 mm in the punched hole of the polishing region for inserting a light-transmitting region, to penetrate the hole. Thereafter, the light-transmitting region prepared in Production Example B-1 was inserted into the hole to prepare a polishing pad. The physical properties etc. of the prepared polishing pad are shown in Table 2.

Example B-2

A polishing pad was prepared in the same manner as in Example B-1 except that the light-transmitting region prepared in Production Example B-2 was used. The physical properties etc. of the prepared polishing pad are shown in Table 2.

Example B-3

A polishing pad was prepared in the same manner as in Example B-1 except that the light-transmitting region prepared in Production Example B-3 was used. The physical properties etc. of the prepared polishing pad are shown in Table 2.

Example B-4

A polishing pad was prepared in the same manner as in Example B-1 except that the light-transmitting region prepared in Production Example B-4 was used. The physical properties etc. of the prepared polishing pad are shown in Table 2.

Reference Example B-1

A polishing pad was prepared in the same manner as in Example B-1 except that the light-transmitting region prepared in Production Example B-5 was used. The physical properties etc. of the prepared polishing pad are shown in Table 2.

Comparative Example B-1

A polishing pad was prepared in the same manner as in Example B-1 except that the light-transmitting region prepared in Production Example B-6 was used. The physical properties etc. of the prepared polishing pad are shown in Table 2.

Reference Example B-2

A polishing pad was prepared in the same manner as in Example B-1 except that the light-transmitting region prepared in Production Example B-7 was used. The physical properties etc. of the prepared polishing pad are shown in Table 2.

performed with acidic slurry. When the light transmittance over the whole range of wavelengths of 500 to 700 nm is less than 80% (Reference Example B-2), the detection accuracy of film thickness is not sufficient.

INDUSTRIAL APPLICABILITY

The polishing pad of the present invention is used in planarizing an uneven surface of a wafer by chemical mechanical polishing (CMP) and specifically used in sensing a polished state etc. by an optical means in CMP using an alkaline slurry or acidic slurry.

The invention claimed is:

1. A method of manufacturing a polishing pad used for chemical mechanical polishing comprising a polishing region, and a light-transmitting region, said method comprising:

selecting a light transmittance material as material having a ΔT of 10 or less which is defined by the equation $$\Delta T = T_0 - T_1$$

wherein $T_1$ is a light transmittance of the material for the light-transmitting region in percentage as measured at a plurality of wavelengths between 400 and 700 nm after dipping the material in an $H_2O_2$ aqueous solution at pH 4 for 24 hours and $T_0$ is a light-transmittance of the material in percentage as measured at the plurality of the wavelengths before the dipping, and the light-transmitting region is in single layer structure comprising a polyurethane resin comprising 4,4'-diphenylmethane diisocyanate as an organic isocyanate and at least one high-molecular-weight polyol selected from the group

TABLE 2

| | | Example B-1 | Example B-2 | Example B-3 | Example B-4 | Reference Example B-1 | Comparative Example B-1 | Reference Example B-2 |
|---|---|---|---|---|---|---|---|---|
| Light transmittance (%) before dipping in $H_2O_2$ aqueous solution | 700 nm | 94.2 | 94.1 | 93.2 | 93.4 | 93.6 | 95.1 | 40.2 |
| | 600 nm | 95.0 | 94.8 | 94.0 | 94.1 | 93.1 | 95.3 | 37.1 |
| | 500 nm | 94.9 | 94.8 | 93.7 | 93.5 | 89.2 | 94.8 | 29.9 |
| | 400 nm | 83.1 | 75.9 | 51.4 | 71.2 | 27.3 | 85.1 | 9.8 |
| Light transmittance (%) after dipping in $H_2O_2$ aqueous solution | 700 nm | 90.6 | 92.3 | 92.2 | 92.5 | 92.5 | 85.1 | 38.9 |
| | 600 nm | 91.4 | 93.0 | 92.2 | 93.1 | 92.4 | 84.5 | 36.2 |
| | 500 nm | 92.4 | 93.4 | 91.9 | 92.3 | 88.1 | 82.7 | 28.9 |
| | 400 nm | 80.6 | 67.9 | 42.4 | 69.4 | 23.3 | 72.0 | 6.7 |
| ΔT(%) | 700 nm | 3.6 | 1.8 | 1.0 | 0.9 | 1.1 | 10.0 | 1.3 |
| | 600 nm | 3.6 | 1.8 | 1.8 | 1.0 | 0.7 | 10.8 | 0.9 |
| | 500 nm | 2.5 | 1.4 | 1.8 | 1.2 | 1.1 | 12.1 | 1.0 |
| | 400 nm | 2.5 | 8.0 | 9.0 | 1.8 | 4.0 | 13.1 | 3.1 |
| Maximum light transmittance (%) at 400 to 700 nm | | 95.1 | 94.8 | 94.5 | 94.1 | 93.1 | 95.4 | 40.2 |
| Minimum light transmittance (%) at 400 to 700 nm | | 83.1 | 75.9 | 51.4 | 71.2 | 27.3 | 85.1 | 9.8 |
| Change rate (%) in light transmittance | | 12.6 | 19.9 | 45.6 | 24.3 | 70.7 | 10.8 | 75.6 |
| Film thickness detection evaluation A | Before dipping | ○ | ○ | ○ | ○ | Δ | ○ | x |
| | Before and after dipping | ○ | ○ | ○ | ○ | ○ | x | ○ |
| Film thickness detection evaluation B | Before dipping | ○ | ○ | ○ | ○ | ○ | ○ | x |
| | Before and after dipping | ○ | ○ | ○ | ○ | ○ | x | ○ |
| Polishing speed (Å/min) | | 3300 | 3250 | 3300 | 3200 | 3300 | 3300 | 3250 |
| In-plane uniformity (%) | | 10 | 8 | 9 | 9 | 8 | 9 | 10 |

As can be seen from Table 2, when ΔT is within 10% (Examples B-1 to B-4, Reference Example B-1), high-precision end-point optical detection can be continuously maintained over a long period even if polishing is performed with acidic slurry. When ΔT is over 10% (Comparative Example B-1), high-precision end-point optical detection cannot be continuously maintained over a long period if polishing is consisting of polycaprolactone polyol, polyester polycarbonate polyol, and polyester polyol formed from adipic acid, hexane diol, and ethylene glycol, and inserting the selecting material to the light transmitting region on the polishing pad.

2. The method of manufacturing a polishing pad according to claim 1, wherein the selecting process further comprising selecting the light transmittance material having the change rate in the light transmittance of the light-transmitting region in wavelength measurements of 400 to 700 nm before dipping is 50 (%) or less, wherein the change rate (%)={(maximum light transmittance in 400 to 700 nm minimum light transmittance in 400 to 700 nm)/maximum light transmittance in 400 to 700 nm}×100.

3. The method of manufacturing a polishing pad according to claim 1, further comprising providing non foam material for the light transmitting region.

4. The method of manufacturing a polishing pad according to claim 1, further comprising providing fine-cell foam for the polishing region.

5. The method of manufacturing a polishing pad according to claim 1, further comprising providing grooves on the polishing side of the polishing region.

6. The method of manufacturing a polishing pad according to claim 1, further comprising determining ΔT by a method comprising:
   measuring light transmittance of the light transmitting material,
   dipping the material in an $H_2O_2$ aqueous solution at pH 4 for 24 hours, and
   measuring light transmittance of said material after dipping.

7. A method of manufacturing a polishing pad used for chemical mechanical polishing comprising a polishing region, and a light-transmitting region, said method comprising:
   selecting a light transmittance material as material having a ΔT of 10 or less which is defined by the equation $$\Delta T = T_0 - T_1$$

wherein $T_1$ is a light transmittance of the material for the light-transmitting region in percentage as measured at a plurality of wavelengths between 400 and 700 nm after dipping the material in an KOH aqueous solution at pH 11 for 24 hours and $T_0$ is a light-transmittance of the material in percentage as measured at the plurality of the wavelengths before the dipping, and the light-transmitting region is in single layer structure comprising a polyurethane resin comprising 4,4'-diphenylmethane diisocyanate as an organic isocyanate and at least one high-molecular-weight polyol selected from the group consisting of polycaprolactone polyol, polyester polycarbonate polyol, and polyester polyol formed from adipic acid, hexane diol, and ethylene glycol, and inserting the selecting material to the light transmitting region on the polishing pad.

8. The method of manufacturing a polishing pad according to claim 7,
   wherein the selecting process further comprising selecting the light transmittance material having the change rate in the light transmittance of the light-transmitting region in wavelength measurements of 400 to 700 nm before dipping is 50 (%) or less,
   wherein the change rate (%)={(maximum light transmittance in 400 to 700 nm minimum light transmittance in 400 to 700 nm)/maximum light transmittance in 400 to 700 nm}×100.

9. The method of manufacturing a polishing pad according to claim 7, further comprising providing non foam material for the light transmitting region.

10. The method of manufacturing a polishing pad according to claim 7, further comprising providing fine-cell foam for the polishing region.

11. The method of manufacturing a polishing pad according to claim 7, further comprising providing grooves on the polishing side of the polishing region.

12. The method of manufacturing a polishing pad according to claim 7, further comprising determining ΔT by a method comprising:
   measuring light transmittance of the light transmitting material,
   dipping the material in an KOH aqueous solution at pH 11 for 24 hours, and
   measuring light transmittance of said material after dipping.

* * * * *